United States Patent
Allen et al.

(10) Patent No.: US 10,782,355 B2
(45) Date of Patent: Sep. 22, 2020

(54) SYSTEMS AND METHODS FOR AN OPEN WIRE SCAN

(71) Applicant: INTERSIL AMERICAS LLC, Milpitas, CA (US)

(72) Inventors: Anthony John Allen, Campbell, CA (US); Edgardo A. Laber, Monte Sereno, CA (US)

(73) Assignee: Intersil Americas LLC, Milpitas, CA (US)

( * ) Notice: Subject to any disclaimer, the term of this patent is extended or adjusted under 35 U.S.C. 154(b) by 0 days.

(21) Appl. No.: 16/350,211

(22) Filed: Oct. 16, 2018

(65) Prior Publication Data

US 2019/0056454 A1 Feb. 21, 2019

Related U.S. Application Data

(62) Division of application No. 14/553,910, filed on Nov. 25, 2014, now Pat. No. 10,101,403.

(60) Provisional application No. 62/020,117, filed on Jul. 2, 2014.

(51) Int. Cl.
| | |
|---|---|
| *G01R 31/36* | (2020.01) |
| *G01R 31/396* | (2019.01) |
| *G01R 31/50* | (2020.01) |
| *G01R 31/3835* | (2019.01) |
| *G01R 19/165* | (2006.01) |

(52) U.S. Cl.
CPC .......... *G01R 31/396* (2019.01); *G01R 31/50* (2020.01); *G01R 19/16542* (2013.01); *G01R 31/3835* (2019.01)

(58) Field of Classification Search
CPC .............. G01R 31/025; G01R 31/3835; G01R 19/16542; G01R 31/026; G01R 31/396
See application file for complete search history.

(56) References Cited

U.S. PATENT DOCUMENTS

| | | | |
|---|---|---|---|
| 2007/0268028 A1* | 11/2007 | Moyer | H02H 3/05 324/713 |
| 2012/0081128 A1* | 4/2012 | Laber | G01R 31/026 324/537 |

* cited by examiner

*Primary Examiner* — Alesa Allgood
(74) *Attorney, Agent, or Firm* — Foley & Lardner LLP (57) ABSTRACT

Systems and methods for an open wire scan are provided. In certain embodiments, An apparatus comprising a circuit includes a plurality of inputs for connecting with a plurality of outputs of a multi-cell battery pack; and an open connection detection circuit, formed within the circuit, for detecting an open connection on at least one of the plurality of inputs connected to the multi-cell battery pack and generating a fault condition responsive thereto. The open connection detection circuit comprises at least one current source device; and at least one device for turning on and off the at least one current source device. The open connection detection circuit also comprises at least one amplifier; an analog to digital converter; and a control logic circuit.

18 Claims, 8 Drawing Sheets

SYSTEMS AND METHODS FOR AN OPEN WIRE SCAN

CROSS-REFERENCE TO RELATED APPLICATIONS

This application is a divisional of U.S. patent application Ser. No. 14/553,910, filed Nov. 25, 2014, now U.S. Pat. No. 10,101,403, which application claims the benefit of U.S. Provisional Patent Application Ser. No. 62/020,117, filed on Jul. 2, 2014, all such applications being incorporated herein by reference.

BACKGROUND

When an integrated circuit ('IC') manages a multi-cell battery, there are multiple wireline connections between the multi-cell battery and the integrated circuit. The connections between the multi-cell battery and the integrated circuit may have a bad or open connection on the connecting wires at any particular point in time. The ability to detect an open circuit condition between a multi-cell battery and an integrated circuit device benefits a number of applications such as hybrid or fully electric automobiles. Current methods to determine if an open circuit condition exists over any of these connections between the multi-cell battery and the integrated circuit take a substantial amount of time.

SUMMARY

Systems and methods for an open wire scan are provided. In certain embodiments, An apparatus comprising a circuit including a plurality of inputs for connecting with a plurality of outputs of a multi-cell battery pack; and an open connection detection circuit, formed within the circuit, for detecting an open connection on at least one of the plurality of inputs connected to the multi-cell battery pack and generating a fault condition responsive thereto. The open connection detection circuit comprises at least one current source device coupled between the plurality of inputs connected to the multi-cell battery and a reference voltage; and at least one device for turning on and off the at least one current source device, wherein the at least one device causes a current to flow through an input in the plurality of inputs to which the at least one device is connected. The open connection detection circuit also comprises at least one amplifier for amplifying voltages at adjacent inputs of the plurality of inputs and generating a voltage responsive thereto; an analog to digital converter for measuring the voltage produced by the at least one amplifier, wherein the analog to digital converter measures voltages produced by the at least one amplifier at the beginning and end of a time period; and a control logic circuit for generating a fault detection indication responsive to the voltage indicating an open connection on at least one of the plurality of inputs based on the measured voltages by the analog to digital converter.

DRAWINGS

Understanding that the drawings depict only exemplary embodiments and are not therefore to be considered limiting in scope, the exemplary embodiments will be described with additional specificity and detail through the use of the accompanying drawings, in which.

In accordance with common practice, the various described features are not drawn to scale but are drawn to emphasize specific features relevant to the exemplary embodiments.

DETAILED DESCRIPTION

In the following detailed description, reference is made to the accompanying drawings that form a part hereof, and in which is shown by way of illustration specific illustrative embodiments. However, it is to be understood that other embodiments may be utilized and that logical, mechanical, and electrical changes may be made. Furthermore, the method presented in the drawing figures and the specification is not to be construed as limiting the order in which the individual steps may be performed. The following detailed description is, therefore, not to be taken in a limiting sense.

Figure 1:
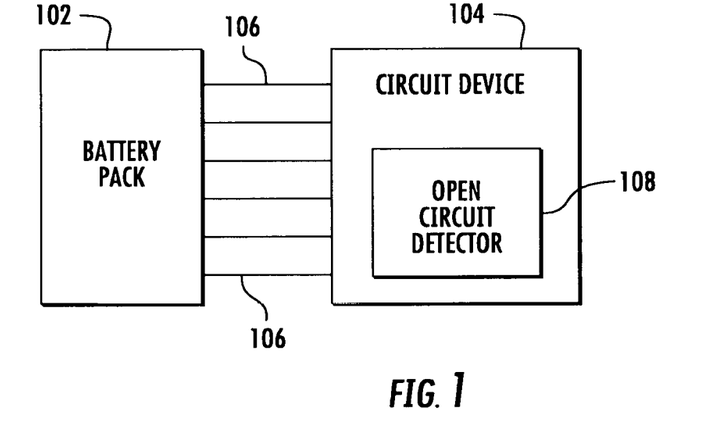
FIG. 1 is a block diagram of an integrated circuit device including open circuit detection circuitry in one embodiment described in the present disclosure.

Referring now to the drawings, and more particularly to FIG. 1, there is illustrated a functional block diagram of a connected multi-cell battery pack 102 and circuit device 104. The multi-cell battery pack 102 comprises a number of series connected cells that provide a plurality of wire connections 106 between the multi-cell battery pack 102 and the circuit device 104 from each connecting node of the cells. In at least one implementation, the circuit device 104 may be an integrated circuit (IC) or implemented using other circuit implementations known to one having skill in the art.

In order to provide a fault detection capability of an open circuit condition, open circuit detector 108 is included within the circuit device 104 to monitor the wireline connections 106 between the battery pack 102 and the circuit device 104. The open circuit detector 108 monitors each of the wires 106 from the multi-cell battery pack 102 and upon detection of an open circuit condition generates a fault indication within the circuit device 104. In this manner, the circuit device 104 has the ability to monitor for bad connections with the multi-cell battery pack 102 in a quick and efficient manner.

In at least one implementation, the open circuit detector 108 is able to detect open circuits through two separate methods. A primary method that uses an analog to digital converter (ADC) and a secondary or redundant method that uses comparators and control logic circuitry. The ADC method is able to test the different wireline connections simultaneously as described in greater detail below. In contrast, the comparators and control logic method tests the different wireline connections individually and is described in greater detail in U.S. Pat. No. 8,797,043 (referred to hereinafter as the '043 patent), titled "System and Methods for Detection of Open Connections Between an Integrated Circuit and a Multi-Cell Battery Pack", filed on Jun. 30, 2011 and issued on Aug. 5, 2014, which is incorporated herein by reference.

Figure 2:
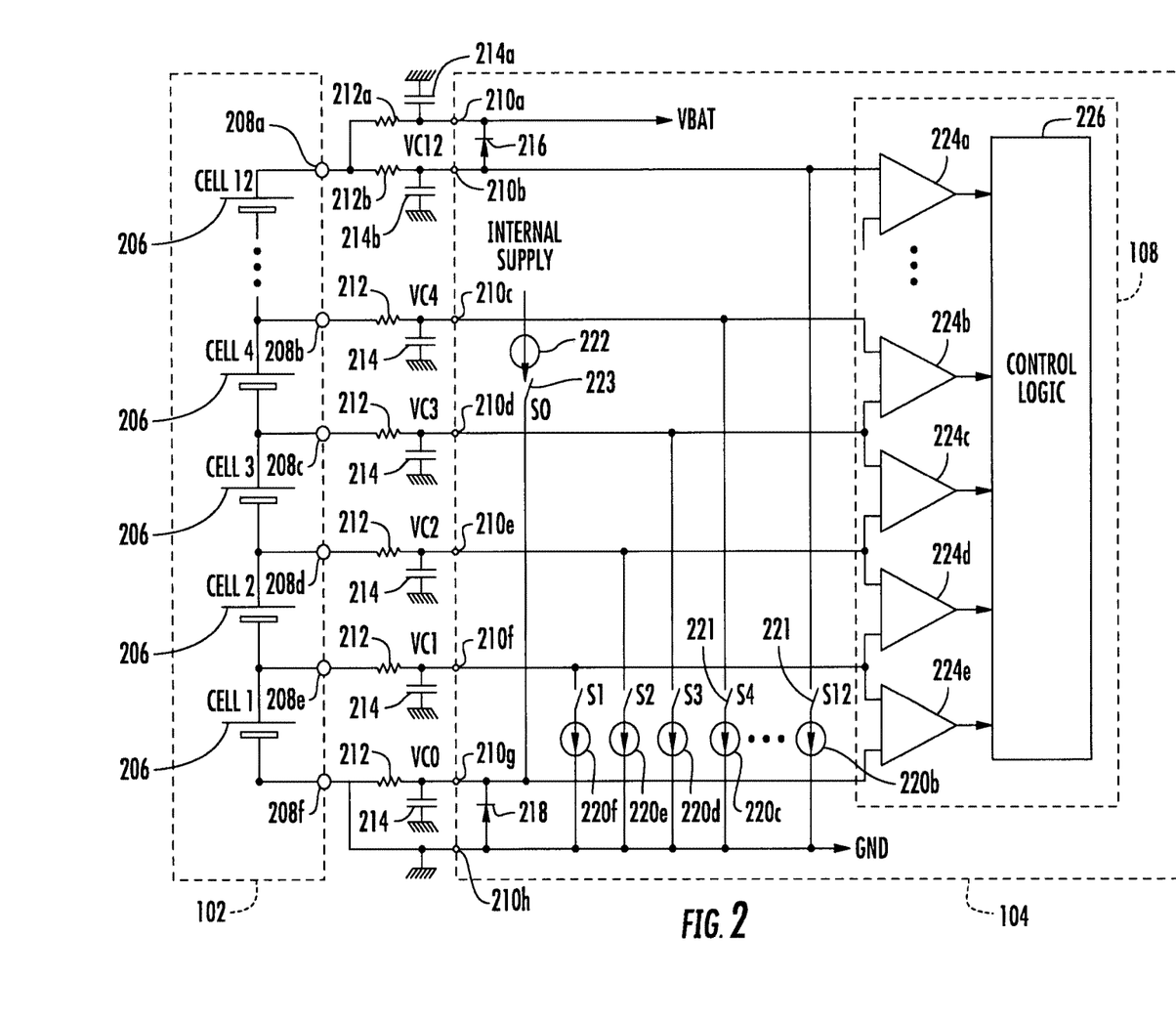
FIG. 2 is a schematic diagram of an open wire detection systems for use with a multi-cell battery pack in one embodiment described in the present disclosure.

Referring now to FIG. 2 and as described in the '043 patent, there is illustrated a schematic diagram of the integrated circuit including a portion of the open circuit detection circuitry that performs the secondary or redundant method. The multi-cell battery 102 consists of a plurality of cells 206 that are connected together in series between a node 208a and the ground node 208f. In the example of FIG. 2, a twelve cell battery is illustrated, however it should be realized that a multi-cell battery including any number of cells would also be applicable to the following description. The multi-cell battery 102 further includes a plurality of output pins 208 for providing differing output voltages from each node within the series connection of battery cells 206. Each of the output pins 208 are connected to an associated pin 210 of the circuit device 104. Connected between each of the output pins 208 of the multi-cell battery 102 and each of the input pins 210 of the circuit device 104 is an optional RC circuit consisting of a resistor 212 having one side connected to an output 208 and the other side connected to an input 210. A capacitor 214 is connected between an input pin 210 and ground. The RC circuit consisting of capacitor 214 and resistor 212 is not directly associated with the open wire detection system and may be omitted without affecting operation of the circuit.

In the example of FIG. 2, at node 208a, there are two RC circuits connected. The first RC circuit consists of resistor 212a and capacitor 214a connected to the rail voltage ($V_{BAT}$) pin 210a. Also connected to multi-cell battery output pin 208a is a second RC circuit consisting of resistor 212b and capacitor 214b connected to input pin 210b. The remaining output pins of the multi-cell battery 102 have a single RC circuit connected thereto. In addition, the ground pin 208f is also directly connected to ground. While the illustration described with respect to FIG. 2 includes each of the RC circuits implemented between the output pins 208 of the multi-cell battery 102 and the input pins 210 of the circuit circuit 104, in alternative embodiments, the RC circuitry could be implemented either within the circuit device 104, or within the multi-cell battery 102, or it may be omitted.

A diode 216 has its cathode connected to pin 210a at the rail voltage $V_{BAT}$. The anode of diode 216 is connected to pin 210b. A second diode 218 has its cathode connected to node 210g while its anode is connected to the ground node 210h. These diodes are used for detecting an open circuit on the rail voltage pin and ground voltage pin in the manner described herein below.

A plurality of current sources 220a through 220f are connected between one of the associated input pin nodes 210 of the circuit device 104 and a reference voltage such as ground. Thus, current source 220b is connected between input pin node 210b and ground, current source 220c is connected between input pin node 210c and ground and so forth. A switch 221 is connected between the input pin node and each of the current sources 220. This is used for turning on and off the current source 220 in order to determine an input voltage at each of the pins 210 as will be more fully described herein below. A current source 222 is connected between the internal supply voltage and pin 210g, where the internal supply may be provided by a single internal supply voltage, multiple different internal supply voltages or the main voltage supply for the chip. A switch 223 is used for turning on and off the current source 222. In at least one implementation, when the inputs 210 are checked separately, instead of a plurality of current sources 220, a single current source may be used that is switched between the different cell connections. In another implementation, a supply voltage more negative than the GND node marked in FIG. 2 may be available, for example when a negative charge pump circuit is included in circuit device 104. Then 222 current could be connected between 210g and another supply voltage, and the current at 210g would have the same direction as the currents at the other 210 pins, and the control logic circuit 334 would be altered accordingly."

Connected to each adjacent input pin 210 of the open circuit detection circuitry within the circuit device 104 are a series of comparators 224. Comparator 224a compares the voltage at the positive terminal of cell 12 and the negative terminal of cell 12. The comparator 224b compares the voltage from the positive terminal of cell 4 and the negative terminal of cell 4. The comparator 224c compares the voltage from the positive terminal of cell 3 with the voltage at the negative terminal of cell 3. Comparator 224d compares the voltage from the positive terminal of cell two with the voltage at the negative terminal of cell 2 and the comparator 224e compares the voltage at the positive terminal of cell 1 with the voltage at the negative terminal of cell 1. The outputs of the comparators 224 are provided to control logic circuit 226 which determines whether an open condition exists between the multi-cell battery 102 and the circuit device 104 responsive to the output of comparators 224. Further, a single comparator may be used that is coupled to the cells through a multiplexor.

Within the circuit of FIG. 2, the open circuit detector 108 within the circuit device 104 monitors each of the outputs from the multi-cell battery pack 102. The control logic circuit 226 utilizes the output signals from the comparators 224 to determine if an open connection exists between the multi-cell battery pack 102 and the circuit device 104. This is accomplished in the following manner. If a power connection is broken between the output pin 208a of the multi-cell battery 102 and the input pin 210a of the circuit device 104, the power supply current of the circuit device 104 is provided from pin 210b through diode 216. The control logic circuit 226 detects the occurrence of a fault condition by determining that the diode 216 between pins 210a and 210b is forward biased.

Similarly, if the ground connection is broken between pin 208f of the multi-cell battery 102 and the input pin 210h of the circuit device 104, the ground current of the circuit device 104 is returned to the negative terminal of the multi-cell battery pack 102 through diode 208 and is placed in the forward biased condition. The control logic circuit 226 of the integrated circuit device detects the fault condition by measuring that the diode 218 between pins 210h and 210g is forward biased.

In order to detect a bad connection from any of pins 210g through 210b, the open detection circuitry of the circuit device 104 applies a current at each of these pins using current sources 220b through 220f, respectively. These current sources 220 are turned on by closing the associated switch 221 associated with the current source 220. The current sources 220 may be turned on separately or at the same time. Detection coverage is higher if the current sources 220 are turned on separately as this allows two adjacent disconnected cells to be properly detected. The open circuit detection circuitry of the integrated circuit device senses if the voltages on adjacent pins change significantly enough to determine that there is a poor or open connection between the multi-cell battery pack 102 and the circuit device 104. In the illustration of FIG. 2, the currents are applied to each pin 210 using current sources 220. Each of these current sources are turned on and off responsive to the switch 221 that is in series with the current source 220 such that the current source 220 may be turned on and off at different times. The comparators 224 monitor the voltages between adjacent pins and are used to determine significant voltage changes between the pins.

For example, if the connection from pin 210d and pin 208e is removed, when the current source 220d is turned on, the voltage at pin 210d will be lower than the voltage at pin 220e. This will be indicated by a change in the output of comparator 224c. Responsive to the change in the output of the comparator 224c, the control logic circuit 226 generates a fault indication indicating the open circuit condition. An open circuit condition at any of the remaining pins 220b through 220g are detected in a similar manner to determine if an open condition exists at any point between the multi-cell battery 102 and the circuit device 104.

In certain embodiments currents flow into some of the pins 210 and out of other pins 210. For example, current may flow out of pins 210d-210g as shown in FIG. 2. An open input on 210d-210g may result in the input being pulled up until either the internal Electro Static Discharge (ESD) structure clamps or the body diode of an external MOSFET conducts. The latter of these mechanisms may pin the cell voltage to twice the normal cell voltage plus one diode drop. The cell voltage being twice the normal cell voltage plus one diode drop then becomes the start condition for the open wire test of the cell below the open condition. The test may then be applied for sufficient time to overcome the high starting voltage to provide enough signal swing to trip a fault. In at least one implementation, inputs 210, with current sources 220 attached, allow the pin current to be pulled down towards the open wire comparator threshold, leading to easier or earlier detection.

To overcome the time used to pull down, all inputs except input 210g may be designed so that current flows into the pins. By having the current flow into the pins, the system is able to detect open conditions with greater reliability and speed. In an alternative implementation, the system 100 may be designed to operate with inputs from which current always flows out of the pin with similar benefits.

Figure 3:
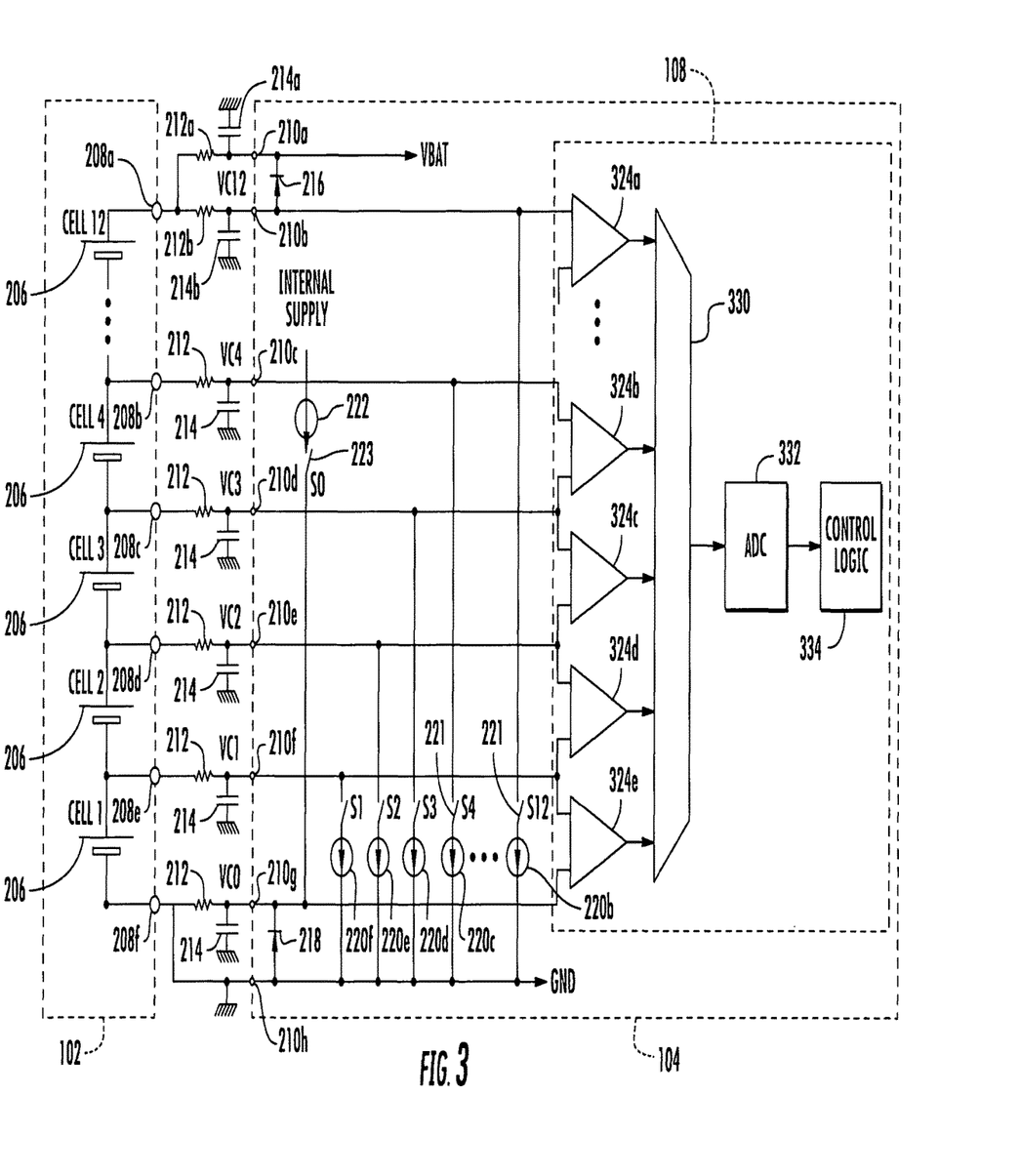
FIG. 3 is a schematic diagram of an open wire detection systems for use with a multi-cell battery pack in one embodiment described in the present disclosure.

Referring now to FIG. 3, there is illustrated a schematic diagram of the integrated circuit including a portion of the open-circuit detection circuitry that performs the primary method. The multi-cell battery 102 along with the output pins 208, the input pins 210, the capacitors 214, the resistors 202, the diodes 216 and 218, the plurality of current sources 220, the switches 221 and 223, and the current source 222 function substantially as described above in regards to FIG. 2. However, in certain implementations, instead of comparators (like comparators 224), amplifiers 324 receive the signals from the cells and then feed the new amplified signal into an ADC 332 through a multiplexer 330 and then into a control logic circuit 334 that detects whether an open-circuit condition exists. Alternatively, the amplifiers 324 may be buffers, or sample and hold circuits. Also, in at least one implementation, the system shown in FIG. 3 and the system shown in FIG. 2 may operate in parallel. As described above, the amplifiers 324 and the comparators 224 are comparing devices that are intended to provide a comparison between two different inputs from the multi-cell battery 102.

In contrast to the plurality of comparators that provide signals to the control logic circuitry, the ADC 332 and control logic circuit 334 test the inputs before current is applied to the inputs 210 through current sources 220 for a period of time. In at least one implementation, where amplifiers 324 are sample and hold circuits, the amplifiers 324 sample the inputs 210 and then the ADC 332 measures the amplifiers 324 individually. In at least one implementation, the ADC 332 simultaneously measures the individual amplifiers 324. The ADC 332 and the control logic circuit 334 then also test the inputs at some time after the current sources are applied to the inputs, either after or during the application of the current sources. In at least one implementation, the ADC 332 makes a measurement of the different values received through the comparators at the beginning and end of the time period. For example, the current may be applied for 1.5 ms and ADC 332 measurements are made at the beginning and end of (for example, before and after) the desired interval. The difference in the values measured by the ADC 332 before and after the time period of current application may be used to determine the open wire condition at each input. In a further implementation, the ADC 332 cycles through the different inputs. When the ADC 332 cycles through the different inputs, the system incorporates further timing information between the different inputs in order to determine the difference between the values.

In certain implementations, the control logic circuit 334 performs a logic decode by comparing the measurements made by the ADC 332 before and after the time period. In certain implementations, the control logic circuit 334 is separate from the control logic circuit 226 described above in relation to FIG. 2. However, in alternative implementations, the control logic circuit 334 and the control logic circuit 226 may be part of the same controller. In at least one embodiment, the control logic circuit 334 performs the logic decode by looking for positive and negative peaks in the measurements acquired at the start and end of the test period by the ADC 332 to determine the connection status of each of the inputs 210. Differences between the measurements taken at the start of the test period and the measurements taken at the end of the test period which are less than a particular threshold, such as 250 mV, may be ignored and effectively assigned a zero value to prevent against false detection due to the performance of other tests. Further, the threshold value may be set to provide a margin of error for current source and external resistor variations and noise. The threshold may be programmable allowing optimization for a variety of component accuracy levels and operating environments.

In performing the logic decode, the control logic circuit 334 steps through the different cells and the first negative peak encountered corresponds to the firstwire input. For example, a negative peak on cell 2 indicates that VC2 is open. The control logic 334 then proceeds to find the next positive peak following a negative peak, which denotes the next input that is not open. For example, if the control logic circuit 334 encounters a negative peak for VC2 and VC2 is the only open input, then the control logic circuit 334 would find a positive peak associated with VC3 and the other cell data would be nominally zero. Further, if both VC2 and VC3 were open then the control logic would identify a negative peak associated with cell 2 and a positive peak associated with cell 4, where the data associated with the other cells would be nominally zero. In an alternative implementation, the first positive peak may denote the first open cell and the first negative peak after the first positive peak may denote the first closed cell after the first open cell. Whether the first open cell is denoted by a positive or a negative peak may depend on the sense of the currents applied to the inputs 210 and the directions in which the control logic circuit 334 scans the received data.

In certain implementations, the "shape" of the results measured by the ADC 332 may vary with the topology of the input networks. For example, input networks, with all capacitors 214 connected to ground, may provide the cleanest response shape with the nominally zero results close to zero value. Input networks with differentially connected capacitors may produce interaction between the cell measurements and can provide nominally zero values that are well above the threshold. However, the interpretation of these results from different input networks may be the same.

Figure 4:
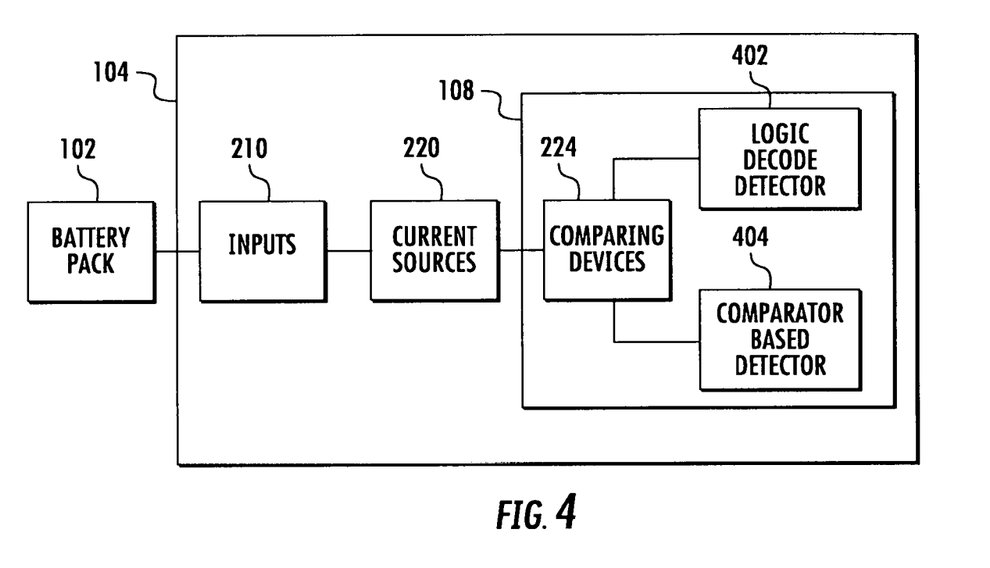
FIG. 4 is a block diagram of a system for performing redundant detection of open connections in one embodiment described in the present disclosure.

FIG. 4 is a high level block diagram of the combination of the system logic decode detector 402 described in FIG. 3 and the comparator based open wire detection system 404 described in FIG. 2. As illustrated, battery pack 102 functions in a similar manner as described above in relation to FIG. 1. Also, the inputs 210, current sources 220 and comparing device 224 function as described above in relation to FIGS. 2 and 3. As illustrated, the circuit device 104 includes an open circuit detector that includes a logic decode detector 402 and a comparator based open wire detection system 404. In certain implementations, the logic decode detector 402 is the primary detector for the comparing devices and the comparator based open wire detection system 404 is a backup detector. Further, the detection performed by the logic decode detector 402 is described above in relation to FIG. 3 and the detection performed by the comparator based open wire detection system 404 is described above in relation to FIG. 2.

Figure 5A:
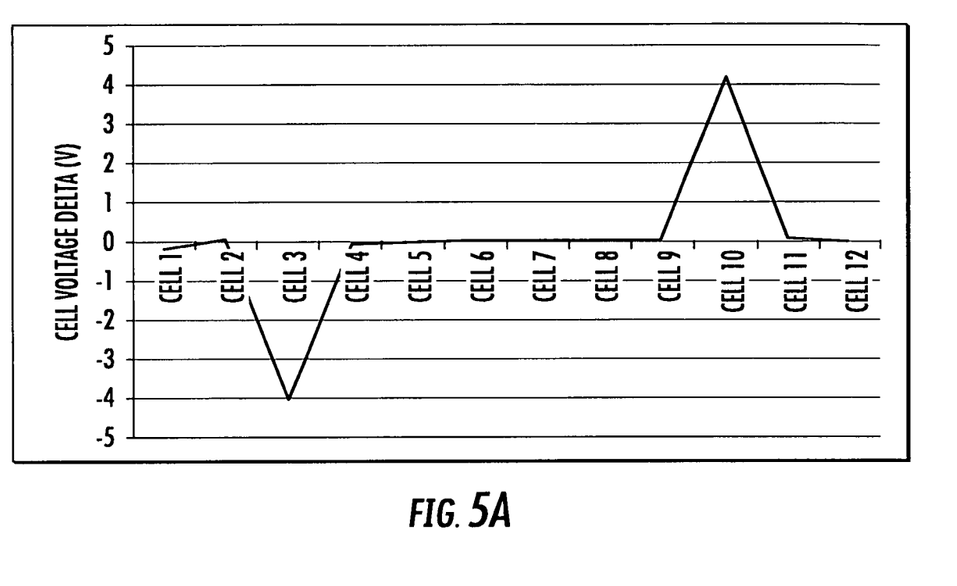
FIGS. 5A and 5B, 6, and 7 are graphs of exemplary data produced by an Analog to Digital Converter in certain embodiments described in the present disclosure.
Figure 5B:
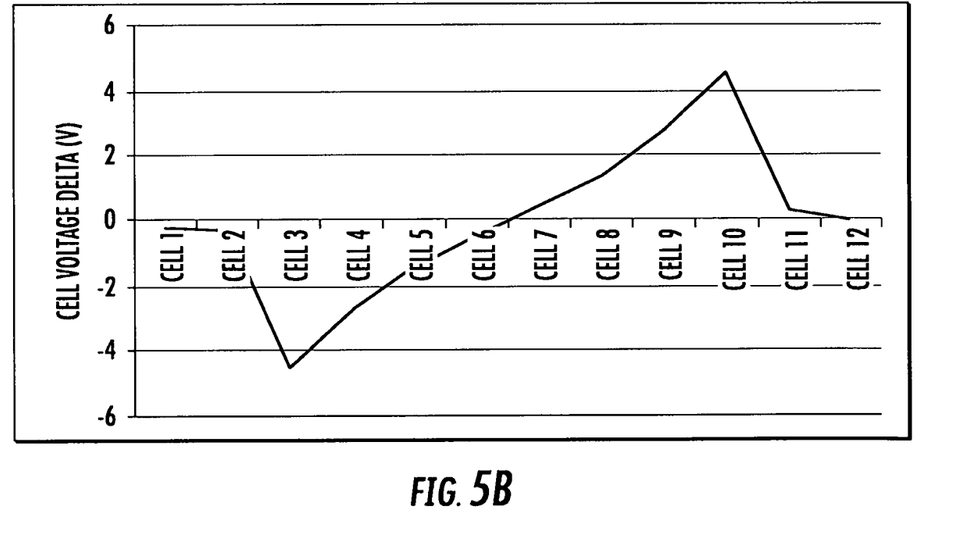

FIGS. 5A and 5B provide an example of input network interaction. Both figures show graphs of the differences between initial measurements and measurements performed at the end of an open wire test when VC3 to VC9 are open. FIG. 5A shows the result obtained when all capacitors 214 are ground referred. The negative peak at cell 3 is followed by a positive peak at cell 10, and the other measurements are nominally zero. FIG. 5B shows the case where some of the input capacitors are differentially connected and the results produced by the analysis. Using the same analysis allows the control logic circuit 334 to identify the first negative peak at cell 3 followed by a positive peak at cell 10, however, the values gradually transition from the first negative peak to the next positive peak.

Figure 6:
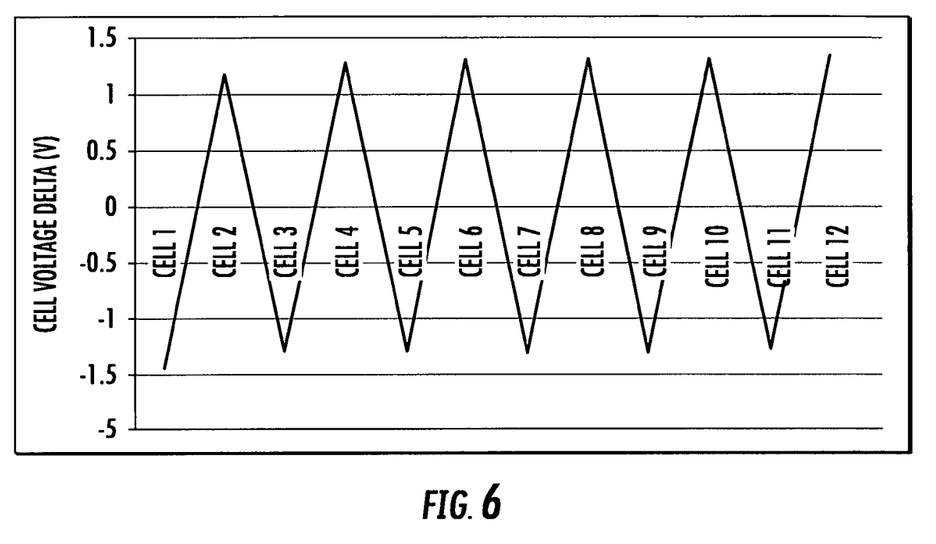
Figure 7:
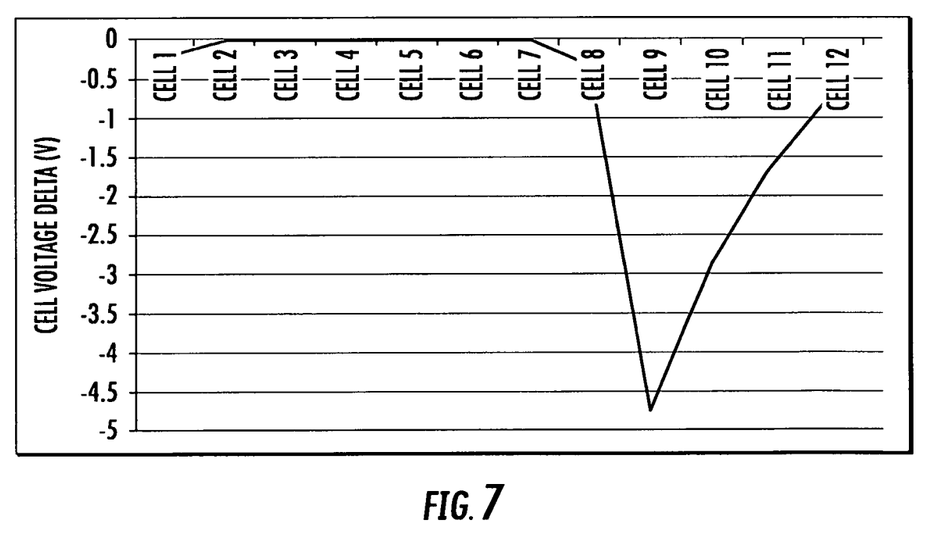

FIGS. 6 and 7 provide other examples of data analyzed by the control logic circuit 334 where the data is measured at the beginning and end of an open wire test. For example, FIG. 6 illustrates the data produced when the connections from the cells are alternatingly open and closed. As shown in FIG. 6, the first negative peak occurs at cell 1, indicating that VC1 is open, the next positive peak occurs at cell 2, indicating that the previous cell was the last input open. Thus, VC1 is open and VC2 is not, the pattern then repeats itself from cell 3-cell 12. FIG. 7 illustrates where the top 4 inputs are open. Accordingly, Cell 9 is the first negative peak but there is no positive peak following the negative peak associated with cell 9. However, when there is no positive peak found after the negative peak, the control logic circuit 334 may identify a non-existent cell above the top cell as being associated with a positive peak. In this situation, cell 13 is identified as the positive peak and cells 9-12 are correctly identified as being open.

Returning to FIG. 2, in certain implementations, a second test may be performed where the current source 222 may only provide a fixed current that is applied for 1 ms or other time period. In at least one exemplary implementations, a coarse comparator function may respond to negative cell input voltages and may turn off a current sink associated with the negative cell input voltage and may also indicate the existence of an open wire fault. The coarse comparator function may operate for VC0 and VC1 differently than for the other inputs 210a-210e. The comparator 224e may compare against a particular threshold that prevents false detection due to the current source 222 and the input resistance. Fault detection may also be performed through standard ADC measurements. In at least one implementation, as described above, the system may perform three basic tests to determine the open connection status of the inputs. These tests are a coarse comparator test, and a negative cell voltage test and a logic decode as measured by the ADC 332.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

Figure 8:
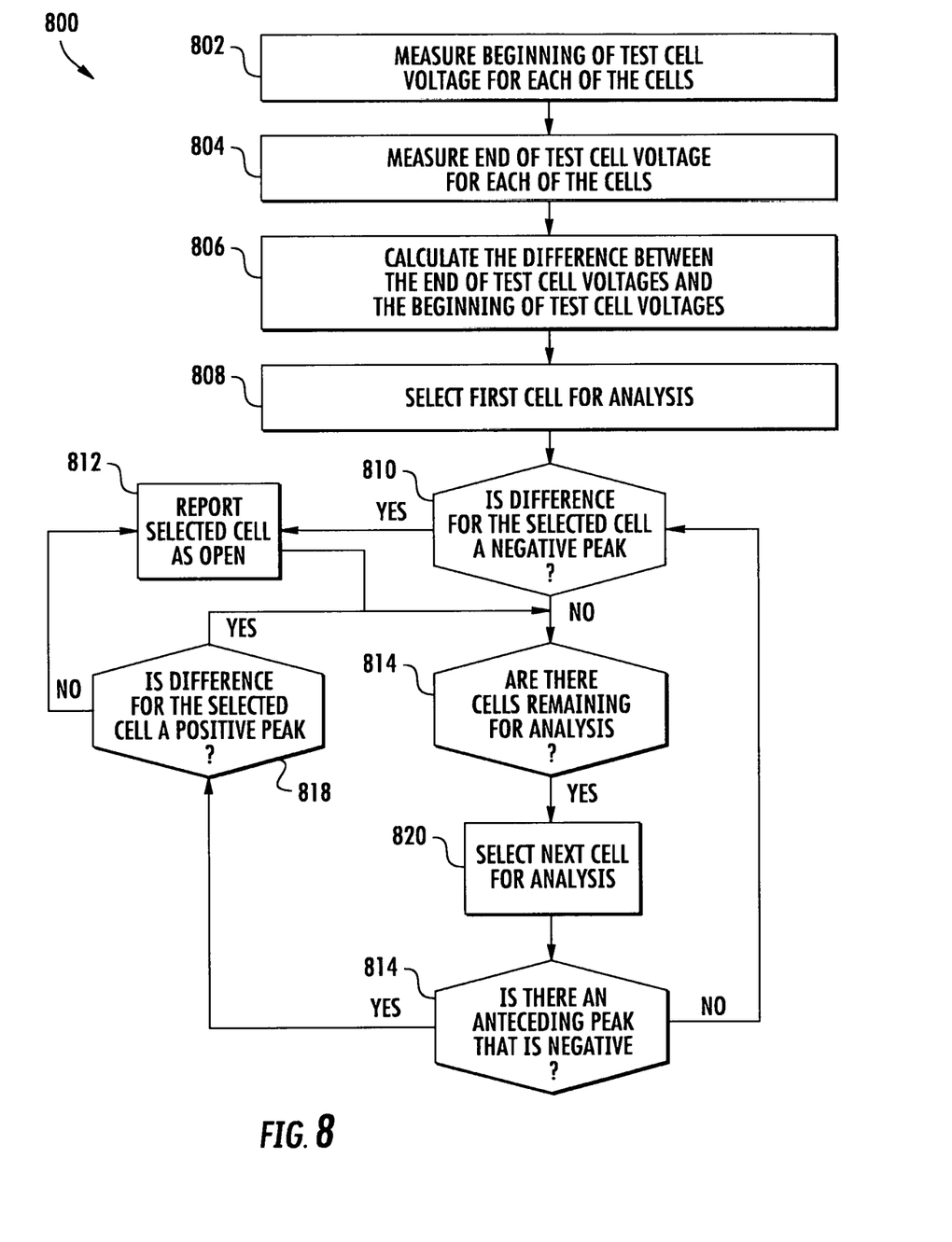
FIG. 8 is a flow diagram of a method for detecting open connections in one embodiment described in the present disclosure.

FIG. 8 is a flow diagram of a method 800 for performing a logic decode as described above. Method 800 proceeds at 802 where the test cell voltage for each of the cells in the battery pack is measured at the beginning of a test. During the test, the current sinks connected between the inputs and the comparing devices are turned on. Before the current sinks are turned on, the cell voltage may be measured for each cell in the battery pack. Further, the method 800 proceeds to 804, where test cell voltage for each of the cells in the battery pack is measured at the end of a test. For example, after the current sinks are turned on, the cell voltage may be measured for each cell in the battery pack. The method 800 then proceeds at 806, where the difference between the end of test cell voltages and beginning of test cell voltages is calculated.

When the differences between the end of test and beginning of test cell voltages are calculated for each cell, the differences are analyzed to identify if any cells are open. For example, method 800 proceeds at 808, where a first cell is selected for analysis. In at least one implementation, the analysis of the different cells may be performed by the control logic circuit described above with relation to FIG. 3, where the control logic circuit incrementally steps through the different cells as it performs the analysis.

In performing one embodiment of the analysis described above with respect to FIGS. 5-7, method 800 determines, at 810, whether the difference between the end of test cell voltages and the beginning of test cell voltages for the selected cell is a negative peak in relation to the differences measured at the proximate cells. If the difference for the selected cell is a negative peak when compared to proximate cells, then method 800 proceeds to 812, where the selected cell is reported as open. After the cell is reported as open, the method 800 proceeds to 814, where it is determined whether there are any cells remaining for analysis. Returning to 810, if it is determined that the difference for the selected cell is not a negative peak, then the method 800 proceeds to 814 to determine if there are remaining cells for analysis. If there are remaining cells for analysis, the method 800 proceeds to 820 by selecting the next cell for analysis. When the next cell is selected, the method proceeds to 824, where it is determined whether there is an anteceding peak that is negative. For example, the logic decode determines if there is a peak associated with the previously analyzed cells and if there is a peak, the logic decode determines whether the peak is the most recently analyzed peak and whether the peak is negative. If the peak is negative, the method 800 proceeds to 818, where it is determined if the difference for the selected cell is a positive peak. If the difference is not a positive peak, when compared to neighboring cells, the method 800 proceeds to 812, where the selected cell is reported as an open cell and then proceeds to 814 as described above. If the difference for the selected cell is determined to be a positive peak, when compared to neighboring cells, the method 800 proceeds to 814 for the determination as to whether there are any cells remaining for analysis. If there are no more cells remaining for analysis, in at least one implementation it may be determined whether the last peak is negative. For example, if the last identified peak was negative, it indicates that every battery cell after the cell associated with the identified peak is open. If the last cells analyzed were open, a non-existent cell may be identified as being closed. For example, a non-existent peak after the analysis of the other cells is used such that the open cells demonstrate the correct behavior. As described above, method 800, performed by the logic decode, identifies the open cells.

Figure 9:
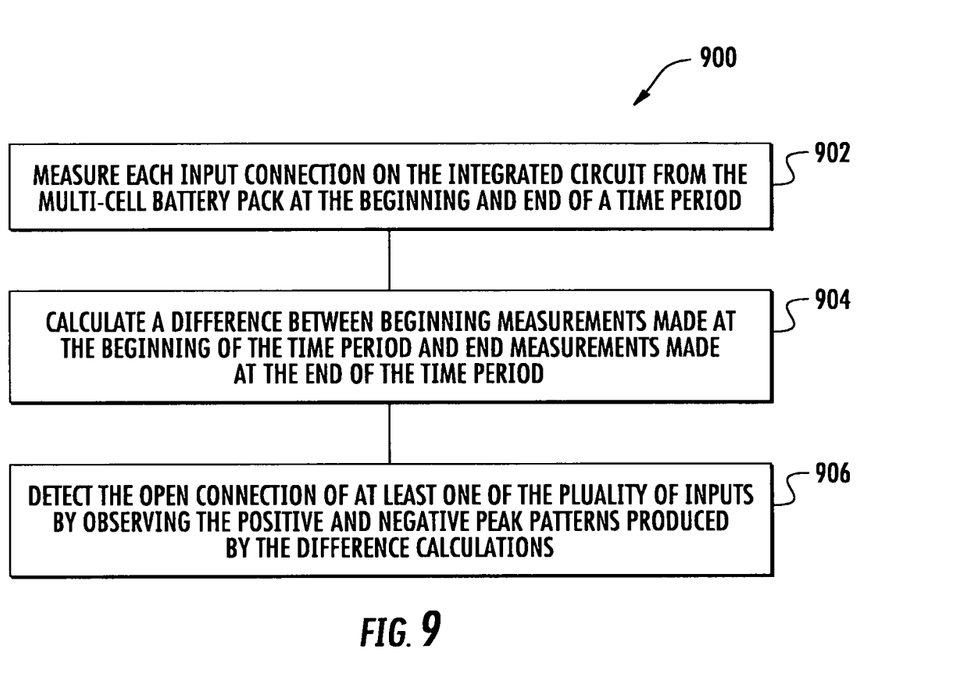
FIG. 9 is a flow diagram of a method for detecting open connections in one embodiment described in the present disclosure.

FIG. 9 is a flow diagram of a method 900 for determining if an open connection exists. Method 900 proceeds at 902 where each input connection on the integrated circuit from the multi-cell battery pack is measured at the beginning and end of a time period. Method 900 then proceeds at 904, where a difference is calculated between beginning measurements made at the beginning of the time period and end measurements made the end of the time period. Further, method 900 proceeds at 906 where the open connection of at least one of the plurality of inputs from the multi-cell battery pack is detected based on the difference between the beginning measurements and the end measurements.

EXAMPLE EMBODIMENTS

Example 1 includes an apparatus, comprising: a circuit including a plurality of inputs for connecting with a plurality of outputs of a multi-cell battery pack; and an open connection detection circuit, formed within the circuit, for detecting an open connection on at least one of the plurality of inputs connected to the multi-cell battery pack and generating a fault condition responsive thereto, the open connection detection circuit comprising: at least one current source device coupled between the plurality of inputs connected to the multi-cell battery and a reference voltage; at least one device for turning on and off the at least one current source device, wherein the at least one device causes a current to flow through an input in the plurality of inputs to which the at least one device is connected; at least one amplifier for amplifying voltages at adjacent inputs of the plurality of inputs and generating a voltage responsive thereto; an analog to digital converter for measuring the voltage produced by the at least one amplifier, wherein the analog to digital converter measures voltages produced by the at least one amplifier at the beginning and end of a time period; and a control logic circuit for generating a fault detection indication responsive to the voltage indicating an open connection on at least one of the plurality of inputs based on the measured voltages by the analog to digital converter.

Example 2 includes the apparatus of Example 1, further comprising: at least one comparator comparing voltages at adjacent inputs of the plurality of inputs and generating a control signal responsive thereto; a second control logic circuit coupled to the at least one comparator, the second control logic circuit generating a fault detection indication responsive to the control signal indicating an open connection on at least one of the plurality of inputs.

Example 3 includes the apparatus of Example 2, wherein the second control logic circuit functions simultaneously with the control logic circuit.

Example 4 includes the apparatus of any of Examples 1-3, wherein the control logic circuit performs a logic decode, wherein, in performing the logic decode, the control logic circuit: steps through the voltages produced by the at least one amplifier; identifies a first cell in the multi-cell battery pack as being open when the first cell is associated with a negative peak in the voltages produced by the at least one amplifier; and identifies a second cell after the first cell in the multi-cell battery pack as being closed when the second cell is associated with a positive peak in the voltages produced by the at least one amplifier.

Example 5 includes the apparatus of Example 4, when the cells after the first cell are open identifying a non-existent cell as being closed wherein the non-existent cell is identified as being after a last cell in the multi-cell battery pack.

Example 6 includes the apparatus of any of Examples 1-5, wherein an output of the at least one amplifier generates the voltage that changes responsive to a voltage at a higher voltage node being lower than a second voltage at a lower voltage node or responsive to an abnormal voltage change.

Example 7 includes the apparatus of any of Examples 1-6, further including a plurality of RC circuits, each RC circuit connected to one of the plurality of pins of the multi-cell battery pack.

Example 8 includes the apparatus of any of Examples 1-7, further including the multi-cell battery pack having a plurality of outputs from a plurality of series connected battery cells, the multi-cell battery pack providing an output to each of the plurality of inputs of the integrated circuit.

Example 9 includes an open connection detection circuit for detecting an open connection on at least one of a plurality of inputs from a multi-cell battery pack, the open connection detection circuit comprising: at least one current source connected between one of the plurality of inputs and a reference voltage, wherein the plurality of inputs are configured to couple to the multi-cell battery pack; at least one device for turning on and off the at least one current source; at least one comparing device for comparing voltages at adjacent inputs of the plurality of inputs and generating a control signal responsive thereto; at least one amplifier for amplifying voltages at adjacent inputs of the plurality of inputs and generating a voltage responsive thereto; an analog to digital converter for measuring voltages produced by the at least one amplifier, wherein the analog to digital converter measures the voltages produced by the at least one amplifier at the beginning and end of a time period; a control logic circuit for generating a fault detection indication responsive to the voltages indicating an open connection on at least one of the plurality of inputs based on the measured voltages by the analog to digital converter; and a second control logic circuit coupled to the at least one comparing device, the second control logic circuit generating a fault detection indication responsive to the control signal indicating an open connection on at least one of the plurality of inputs.

Example 10 includes the open connection detection circuit of Example 9, wherein the second control logic circuit functions as a backup control logic circuit to the control logic circuit.

Example 11 includes the open connection detection circuit of any of Examples 9-10, wherein the control logic circuit performs a logic decode, wherein, in performing the logic decode, the control logic circuit: steps through the voltages produced by the at least one amplifier; identifies a first cell in the multi-cell battery pack as being open when the first cell is associated with a negative peak in the voltages produced by the at least one amplifier; and identifies a second cell after the first cell in the multi-cell battery pack as being closed when the second cell is associated with a positive peak in the voltages produced by the at least one amplifier.

Example 12 includes the open connection detection circuit of Example 11, when the cells after the first cell are open identifying a non-existent cell as being closed wherein the non-existent cell is identified as being after a last cell in the multi-cell battery pack.

Example 13 includes the open connection detection circuit of any of Examples 9-12, wherein an output of the at least one amplifier generates the control signal that changes responsive to a voltage at a higher voltage node being lower than a second voltage at a lower voltage node or responsive to an abnormal voltage change.

Example 14 includes the apparatus of any of Examples 9-12, further including a plurality of RC circuits, each RC circuit connected to one of the plurality of pins of the multi-cell battery pack.

Example 15 includes a method for detecting an open connection between a circuit device and a multi-cell battery, comprising the steps of: measuring a voltage at each input connection on the circuit device from the multi-cell battery pack at the beginning and end of a time period; calculating a difference between beginning measurements made at the beginning of the time period and end measurements made the end of the time period; and detecting the open connection of at least one of the plurality of inputs by observing the positive and negative peak patterns produced by the difference calculations.

Example 16 includes the method of Example 15, further comprising: selectively activating at least one device for turning on and off at least one current source device, the at least one current source device respectively connected with one of the plurality of inputs from the multi-cell battery; and applying a current through each of the plurality of inputs from the at least one current source device.

Example 17 includes the method of any of Examples 15-16, wherein observing the positive and negative peak patterns produced by the difference calculations comprises: stepping through the voltage differences measured at the different inputs in the plurality of inputs; identifying a first cell in the multi-cell battery pack as being open when the first cell is associated with a negative voltage peak; and identifying a second cell after the first cell in the multi-cell battery pack as being closed when the second cell is associated with a positive voltage peak.

Example 18 includes the method of Example 17, when the cells after the first cell are open identifying a non-existent cell as being closed wherein the non-existent cell is identified as being after the last cell.

Example 19 includes the method of any of Examples 15-18, wherein the step of detecting further comprises the steps of: comparing voltages at adjacent inputs of the plurality of inputs; and generating a control signal responsive to the comparison.

Example 20 includes the method of Example 19, wherein the step of generating the control signal further comprises the step of generating the control signal that changes responsive to a voltage at a higher voltage node becoming lower than a second voltage at a previously lower voltage node or responsive to an abnormal voltage change.

Example 21 includes a system comprising: a multi-cell battery pack having a plurality of inputs; and a circuit device comprising: at least one current source connected between one of the plurality of inputs and a reference voltage, wherein the plurality of inputs are configured to couple to the multi-cell battery pack; at least one device for turning on and off the at least one current source; and an open circuit detector comprising: at least one amplifier for amplifying voltages at adjacent inputs of the plurality of inputs and generating a voltage responsive thereto; an analog to digital converter for measuring voltages produced by the at least one amplifier, wherein the analog to digital converter measures the voltages produced by the at least one amplifier at the beginning and end of a time period; and a control logic circuit for generating a fault detection indication responsive to the voltages indicating an open connection on at least one of the plurality of inputs based on the measured voltages by the analog to digital converter.

Example 22 includes the system of Example 21, wherein the open circuit detector further comprises: at least one comparator comparing voltages at adjacent inputs of the plurality of inputs and generating a control signal responsive thereto; a second control logic circuit coupled to the at least one comparator, the second control logic circuit generating a fault detection indication responsive to the control signal indicating an open connection on at least one of the plurality of inputs.

Example 23 includes the apparatus of Example 22, wherein the second control logic circuit functions simultaneously with the control logic circuit.

What is claimed is:

1. An apparatus, comprising:
a circuit including a plurality of inputs for connecting with a plurality of outputs of a multi-cell battery pack; and
an open connection detection circuit, formed within the circuit, for detecting an open connection on at least one of the plurality of inputs connected to the multi-cell battery pack and generating a fault condition responsive thereto, the open connection detection circuit comprising:
at least one current source device coupled between the plurality of inputs connected to the multi-cell battery and a reference voltage;
at least one device for turning on and off the at least one current source device, wherein the at least one device causes a current to flow through an input in the plurality of inputs to which the at least one device is connected;
at least one amplifier for amplifying voltages at adjacent inputs of the plurality of inputs and generating a voltage responsive thereto;
an analog to digital converter for measuring the voltage produced by the at least one amplifier, wherein the analog to digital converter measures voltages produced by the at least one amplifier at the beginning and end of a time period; and
a control logic circuit for generating a fault detection indication responsive to the voltage indicating an open connection on at least one of the plurality of inputs based on the measured voltages by the analog to digital converter,
wherein the control logic circuit performs a logic decode, wherein, in performing the logic decode, the control logic circuit:
steps through the voltages produced by the at least one amplifier;

identifies a first cell in the multi-cell battery pack as being open when the first cell is associated with a negative peak in the voltages produced by the at least one amplifier; and identifies a second cell after the first cell in the multi-cell battery pack as being closed when the second cell is associated with a positive peak in the voltages produced by the at least one amplifier.

2. The apparatus of claim 1, when the cells after the first cell are open identifying a non-existent cell as being closed wherein the non-existent cell is identified as being after a last cell in the multi-cell battery pack.

3. The apparatus of claim 1, wherein an output of the at least one amplifier generates the voltage that changes responsive to a voltage at a higher voltage node being lower than a second voltage at a lower voltage node or responsive to an abnormal voltage change.

4. The apparatus of claim 1, further including a plurality of RC circuits, each RC circuit connected to one of the plurality of pins of the multi-cell battery pack.

5. The apparatus of claim 1, further including the multi-cell battery pack having a plurality of outputs from a plurality of series connected battery cells, the multi-cell battery pack providing an output to each of the plurality of inputs of the integrated circuit.

6. The apparatus of claim 1, wherein the measured voltages from the analog to digital converter used by the control logic circuit to generate the fault detection indication includes beginning voltages and end voltages corresponding to the beginning and end of the time period, respectively.

7. The apparatus of claim 1, further comprising:
at least one comparator comparing voltages at adjacent inputs of the plurality of inputs and generating a control signal responsive thereto;
a second control logic circuit coupled to the at least one comparator, the second control logic circuit generating a fault detection indication responsive to the control signal indicating an open connection on at least one of the plurality of inputs.

8. The apparatus of claim 7, wherein the second control logic circuit functions simultaneously with the control logic circuit.

9. An open connection detection circuit for detecting an open connection on at least one of a plurality of inputs from a multi-cell battery pack, the open connection detection circuit comprising:
at least one current source connected between one of the plurality of inputs and a reference voltage, wherein the plurality of inputs are configured to couple to the multi-cell battery pack;
at least one device for turning on and off the at least one current source;
at least one comparing device for comparing voltages at adjacent inputs of the plurality of inputs and generating a control signal responsive thereto;
at least one amplifier for amplifying voltages at adjacent inputs of the plurality of inputs and generating a voltage responsive thereto;
an analog to digital converter for measuring voltages produced by the at least one amplifier, wherein the analog to digital converter measures the voltages produced by the at least one amplifier at the beginning and end of a time period;
a control logic circuit for generating a fault detection indication responsive to the voltages indicating an open connection on at least one of the plurality of inputs based on the measured voltages by the analog to digital converter; and
a second control logic circuit coupled to the at least one comparing device, the second control logic circuit generating a fault detection indication responsive to the control signal indicating an open connection on at least one of the plurality of inputs,
wherein the control logic circuit performs a logic decode, wherein, in performing the logic decode, the control logic circuit;
steps through the voltages produced by the at least one amplifier;
identifies a first cell in the multi-cell battery pack as being open when the first cell is associated with a negative peak in the voltages produced by the at least one amplifier; and
identifies a second cell after the first cell in the multi-cell battery pack as being closed when the second cell is associated with a positive peak in the voltages produced by the at least one amplifier.

10. The open connection detection circuit of claim 9, wherein the second control logic circuit functions as a backup control logic circuit to the control logic circuit.

11. The open connection detection circuit of claim 9, when the cells after the first cell are open identifying a non-existent cell as being closed wherein the non-existent cell is identified as being after a last cell in the multi-cell battery pack.

12. The open connection detection circuit of claim 9, wherein an output of the at least one amplifier generates the control signal that changes responsive to a voltage at a higher voltage node being lower than a second voltage at a lower voltage node or responsive to an abnormal voltage change.

13. The apparatus of claim 9, further including a plurality of RC circuits, each RC circuit connected to one of the plurality of pins of the multi-cell battery pack.

14. The apparatus of claim 9, wherein the measured voltages from the analog to digital converter used by the control logic circuit to generate the fault detection indication includes beginning voltages and end voltages corresponding to the beginning and end of the time period, respectively.

15. A system comprising:
a multi-cell battery pack having a plurality of inputs; and
a circuit device comprising:
at least one current source connected between one of the plurality of inputs and a reference voltage, wherein the plurality of inputs are configured to couple to the multi-cell battery pack;
at least one device for turning on and off the at least one current source; and
an open circuit detector comprising:
at least one amplifier for amplifying voltages at adjacent inputs of the plurality of inputs and generating a voltage responsive thereto;
an analog to digital converter for measuring voltages produced by the at least one amplifier, wherein the analog to digital converter measures the voltages produced by the at least one amplifier at the beginning and end of a time period; and
a control logic circuit for generating a fault detection indication responsive to the voltages indicating an open connection on at least one of the plurality of inputs based on the measured voltages by the analog to digital converter, wherein the control logic circuit performs a logic decode, wherein, in performing the logic decode, the control logic circuit:

steps through the voltages produced by the at least one amplifier;

identifies a first cell in the multi-cell battery pack as being open when the first cell is associated with a negative peak in the voltages produced by the at least one amplifier; and identifies a second cell after the first cell in the multi-cell battery pack as being closed when the second cell is associated with a positive peak in the voltages produced by the at least one amplifier.

16. The apparatus of claim 15, wherein the measured voltages from the analog to digital converter used by the control logic circuit to generate the fault detection indication includes beginning voltages and end voltages corresponding to the beginning and end of the time period, respectively.

17. The system of claim 15, wherein the open circuit detector further comprises:

at least one comparator comparing voltages at adjacent inputs of the plurality of inputs and generating a control signal responsive thereto;

a second control logic circuit coupled to the at least one comparator, the second control logic circuit generating a fault detection indication responsive to the control signal indicating an open connection on at least one of the plurality of inputs.

18. The apparatus of claim 17, wherein the second control logic circuit functions simultaneously with the control logic circuit.

* * * * *